United States Patent
Zhang

(10) Patent No.: US 7,728,308 B2
(45) Date of Patent: Jun. 1, 2010

(54) APPARATUS FOR BLANKING A CHARGED PARTICLE BEAM

(75) Inventor: Tao Zhang, Cambridge (GB)

(73) Assignee: Nanobeam Limited, Cambridge (GB)

( * ) Notice: Subject to any disclaimer, the term of this patent is extended or adjusted under 35 U.S.C. 154(b) by 438 days.

(21) Appl. No.: 11/628,196

(22) PCT Filed: May 13, 2005

(86) PCT No.: PCT/GB2005/050064

§ 371 (c)(1),
(2), (4) Date: Aug. 2, 2007

(87) PCT Pub. No.: WO2005/119361

PCT Pub. Date: Dec. 15, 2005

(65) Prior Publication Data

US 2008/0061246 A1     Mar. 13, 2008

(30) Foreign Application Priority Data

Jun. 3, 2004    (GB) .................................. 0412428.5

(51) Int. Cl.
*H01J 3/26* (2006.01)
(52) U.S. Cl. .............................. 250/396 R; 250/492.2; 250/505.1
(58) Field of Classification Search ............. 250/396 R, 250/396 ML, 492.1, 492.2, 492.22, 492.23, 250/492.3, 505.1
See application file for complete search history.

(56) References Cited

U.S. PATENT DOCUMENTS

| | | | | |
|---|---|---|---|---|
| 3,715,580 A | * | 2/1973 | Maekawa et al. ........... 250/397 |
| 4,130,761 A | * | 12/1978 | Matsuda .................. 250/492.2 |
| 4,409,487 A | * | 10/1983 | Kuschel et al. .............. 250/398 |
| 4,434,371 A | | 2/1984 | Knauer et al. | |
| 4,445,041 A | | 4/1984 | Kelly et al. | |
| 4,721,909 A | * | 1/1988 | Richardson ................. 324/751 |
| 4,829,243 A | * | 5/1989 | Woodard et al. ............ 324/751 |
| 5,118,949 A | * | 6/1992 | Rappat et al. ........... 250/396 R |
| 5,155,368 A | * | 10/1992 | Edwards et al. ......... 250/396 R |
| 5,276,330 A | * | 1/1994 | Gesley .................... 250/396 R |
| 5,382,895 A | * | 1/1995 | Elmer et al. ................ 324/71.3 |
| 5,637,879 A | * | 6/1997 | Schueler ................. 250/492.21 |
| 5,723,938 A | * | 3/1998 | Kato et al. ................... 313/412 |
| 5,841,145 A | * | 11/1998 | Satoh et al. ............ 250/492.22 |
| 6,005,245 A | * | 12/1999 | Sakairi et al. ............... 250/281 |
| 6,376,850 B1 | * | 4/2002 | Zhang ...................... 250/505.1 |
| 6,521,896 B1 | | 2/2003 | DeVore et al. | |

(Continued)

FOREIGN PATENT DOCUMENTS

DE     42 10 185     1/1993

(Continued)

OTHER PUBLICATIONS

Great Britain Examination Report (3 pages), issued in corresponding GB Application No. GB0412428.5, Dec. 27, 2007.

(Continued)

*Primary Examiner*—Bernard E Souw
*Assistant Examiner*—Michael J Logie

(57) ABSTRACT

A beam blanking unit (1) comprises first and second blanking plates (2, 3) mounted to a support plate (15). A stopper (4) is mechanically and electrically connected to the first blanking plate (2).

18 Claims, 5 Drawing Sheets

U.S. PATENT DOCUMENTS

| | | | |
|---|---|---|---|
| 6,630,668 B1 | 10/2003 | Cramer et al. | |
| 6,977,384 B2 * | 12/2005 | McGinn et al. | 250/423 R |
| 7,109,494 B2 * | 9/2006 | Ono et al. | 250/396 R |
| 2003/0122491 A1 * | 7/2003 | Ives | 315/5.38 |

FOREIGN PATENT DOCUMENTS

| | | |
|---|---|---|
| EP | 0 328 869 | 8/1989 |
| EP | 0 516 098 | 12/1992 |
| GB | 2 389 454 | 12/2003 |

OTHER PUBLICATIONS

Patent Abstracts of Japan, vol. 1997, No. 12, Dec. 25, 1997 & JP 09 204891 (Hitachi Ltd.), Aug. 5, 1997.

* cited by examiner

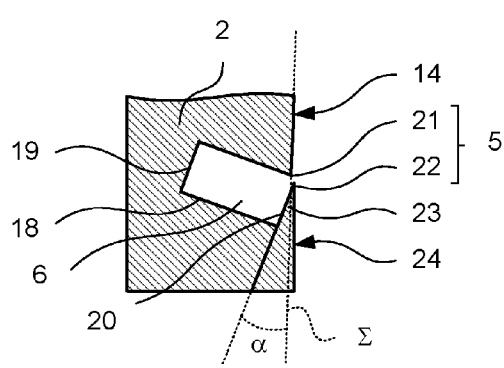
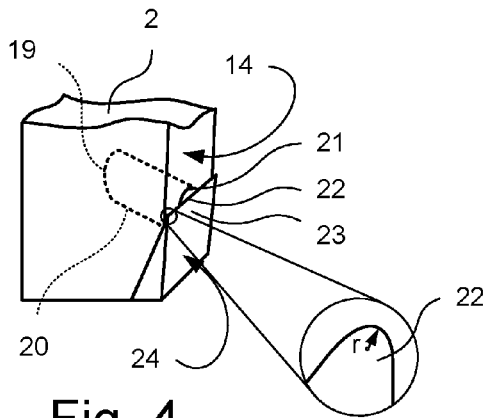
Fig. 3    Fig. 4
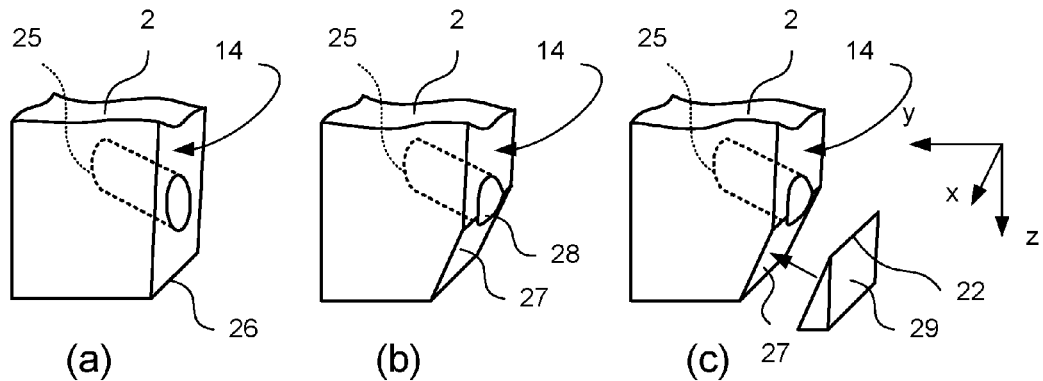
Fig. 5
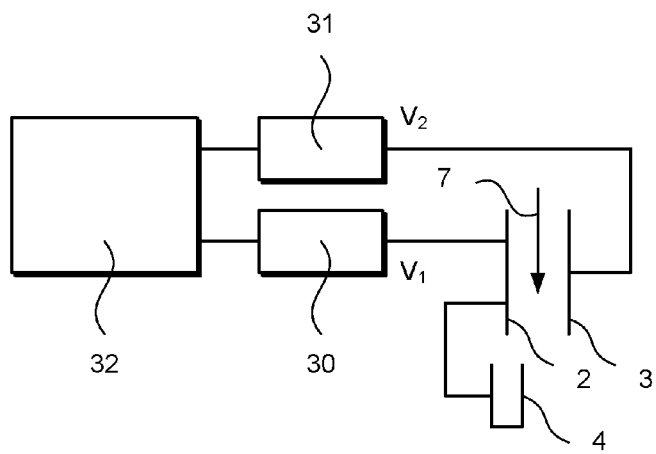
Fig. 6

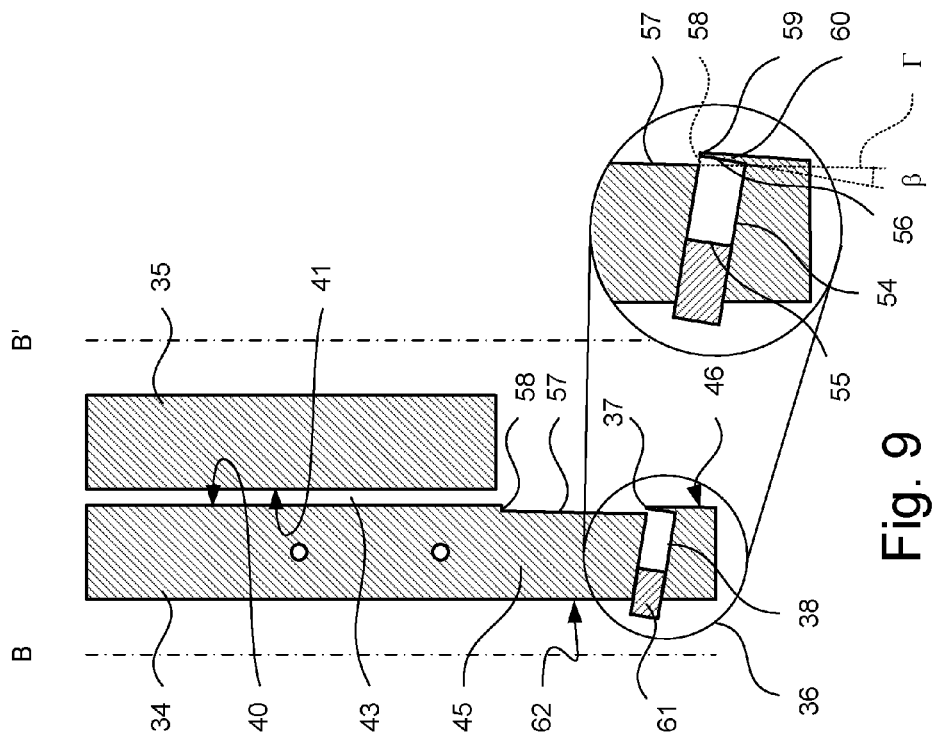
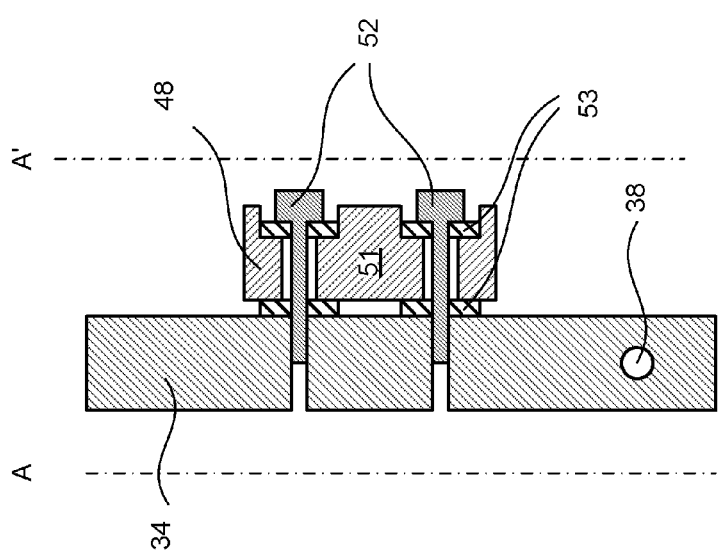
Fig. 9
Fig. 8

APPARATUS FOR BLANKING A CHARGED PARTICLE BEAM

CROSS REFERENCE TO RELATED APPLICATIONS

This is the U.S. National Stage of International Application Number PCT/GB2005/05004 filed 13 May 2005 claiming priority from Great Britain Application GB 0412428 filed 3 Jun. 2004.

FIELD OF THE INVENTION

The present invention relates to apparatus for blanking a charged particle beam, particularly, but not exclusively for use in an electron beam lithography system.

BACKGROUND ART

An electron beam lithography system includes a pair of electrodes for electrostatically deflecting an uninterrupted beam of electrons away from the optical axis towards a stopper and thus "switch" the electron beam "on" and "off". This process is commonly referred to as "blanking".

Normally, the beam is deflected so as to hit a stopper which may be a part of the electron beam column or a block of metal specially provided for the purpose. However, a drawback of this technique is that primary electrons striking the stopper generate secondary and backscatter electrons which charge-up the part of the system through which the electron beam passes.

One solution is to provide a stopper in the form of an aperture or opening with a pocket into which the electron beam is deflected. Although secondary electrons are still generated, they are absorbed by the walls of the pocket. The smaller the aperture, then the fewer secondary electrons escape. However, as the aperture is made smaller, the more difficult it becomes to deflect the beam into the aperture. Therefore, a compromise is usually made by making the aperture small enough to reduce escape of secondary electrons, while keeping it large enough to aid deflection of the electron beam into the aperture.

Another solution is to apply a positive voltage to the stopper. When positively biased, the field draws secondary electrons towards the stopper. Although this technique helps to reduce secondary electrons, it can be difficult to implement since it requires the blanking bias and the collector bias to be switched simultaneously.

Ion beam systems suffer similar problems.

The present invention seeks to provide improved apparatus for blanking a charged particle beam.

SUMMARY OF THE INVENTION

According to the present invention there is provided apparatus for blanking a charged particle beam comprising an electrode for deflecting a charged particle beam and means for stopping a deflected charged particle beam, wherein the stopping means is mechanically supported by the electrode so as to be moveable with the electrode and electrically connected to the electrode so as to be at a bias of the same polarity as the electrode.

The stopping means may be electrically connected to the electrode so as to be at the same bias as the electrode.

The stopping means may include a body, an aperture, a cavity and/or a knife-edge.

The electrode may carry the stopping means. The stopping means may be formed in the electrode. The electrode may include a depending portion and the stopping means may be formed in the depending portion of the electrode.

The apparatus may further comprise means for applying a bias to the electrode. The apparatus may comprise a further electrode.

The apparatus may comprise a cavity which opens to a beam-side face of the electrode or an element supported by the electrode via an aperture. The cavity may be obliquely inclined with respect to said beam-side face. The cavity may be defined by a cylindrical wall, a first end wall providing a closed end to the cavity and a second end wall.

A first portion of the aperture may be defined by a rim portion formed where a roof portion of the cylindrical wall meets the beam-side face. A second portion of the aperture may be defined by a ridge portion of a lip, the lip providing the second end wall. The lip may be arranged to jut out towards an optical axis.

The aperture may be defined by a rim formed where a roof portion of the cylindrical wall and the second end wall meet a recess in the beam-side face.

According to the present invention there is also provided a method of fabricating apparatus for blanking a charged particle beam, the method comprising providing an electrode, drilling a hole into the electrode from a face of the electrode, chamfering a lower edge of the face through the hole to form a chamfer and attaching a wedge to the chamfer so as to cover a portion of the hole.

According to the present invention there is further provided a method of fabricating apparatus for blanking a charged particle beam, the method comprising providing an electrode having first and second faces, the first and second faces being on opposite sides of the electrode, drilling an angled hole into the electrode from the first face whereby a forward edge of the hole stops a given distance from the second face and cutting a recess into the second face, the recess having a depth greater than the given distance so as to break through to the hole.

BRIEF DESCRIPTION OF THE DRAWINGS

Embodiments of the present invention will now be described, by way of example, with reference to the accompanying drawings in which:

FIG. 3 is a cross-section of a portion of a blanking electrode;

FIG. 4 is a perspective view of a portion of a blanking electrode;

FIGS. 5a to 5c illustrate fabrication of the aperture and cavity shown in FIG. 1;

FIG. 6 illustrates a control system for controlling the unit shown in FIG. 1;

FIG. 8 is a cross-sectional view of the beam blanking unit shown in FIG. 7 taken along the line A-A';

FIG. 9 is a cross-sectional view of the beam blanking unit shown in FIG. 7 taken along the line B-B';

DETAILED DESCRIPTION OF THE INVENTION

First Embodiment

Figure 1:
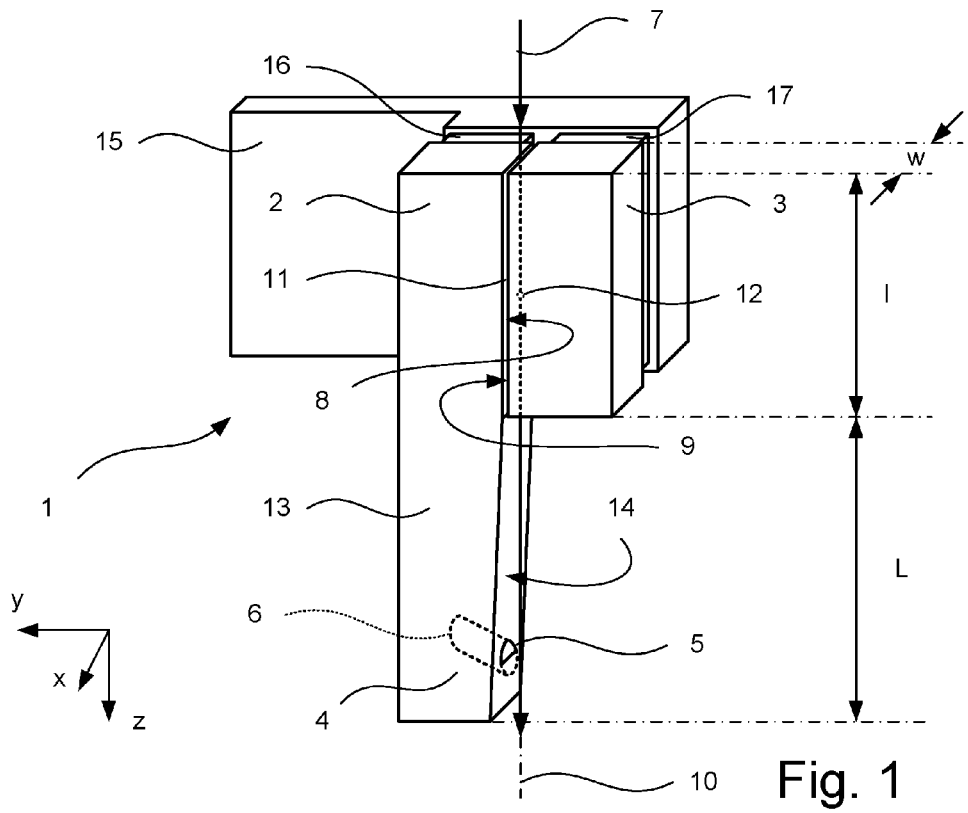
FIG. 1 is perspective view of a first embodiment of a beam blanking unit according to the present invention and an undeflected beam.
Figure 2:
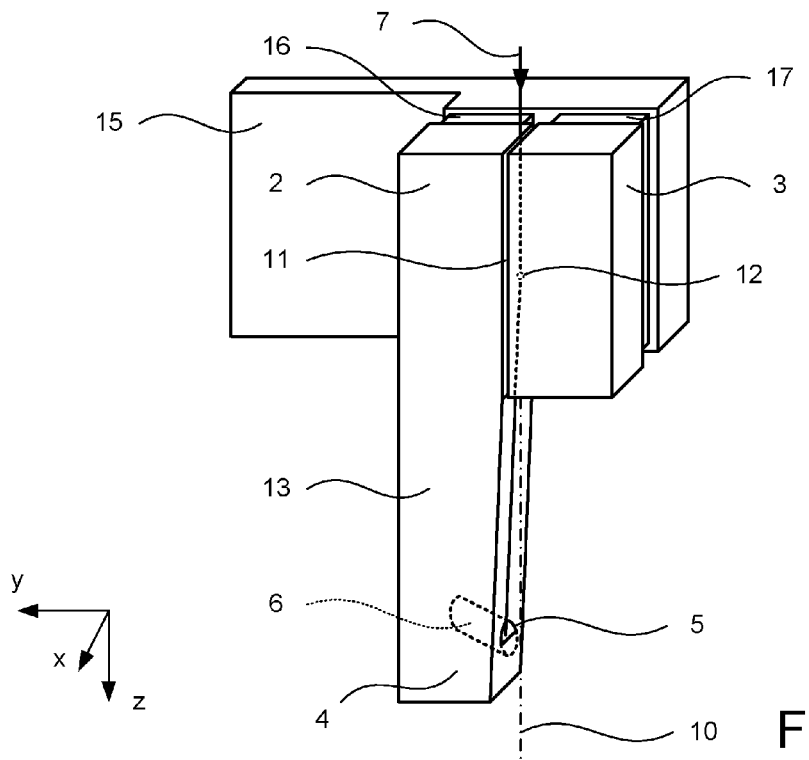
FIG. 2 is perspective view of a first embodiment of a beam blanking unit according to the present invention and a deflected beam.

Referring to FIGS. 1 and 2, a first embodiment of a beam blanking unit 1 according to the present invention is shown. The beam blanking unit 1 includes first and second electrodes 2, 3, commonly referred to as "blanking electrodes" or "blanking plates", and a stopper 4 having an aperture or opening 5 and a cavity 6 for stopping an electron beam 7.

The electrodes 2, 3 are generally elongated and rectangular in transverse cross-section. The electrodes 2, 3 are longitudinally arranged in parallel, with parallel opposing faces 8, 9 either side of an optical axis 10, which define a gap 11 through which the electron beam 7 can pass. The gap 11 between the faces 8, 9 has a width of about 0.5 mm. Each face 8, 9 has a width, w, of about 5 mm and a length, l, of about 10 mm. The electrodes 2, 3 are arranged such that an intermediate focus point or crossover 12 of the electron beam 7 is found about halfway down the gap 11. This is to provide conjugate blanking, i.e. blanking where the beam does not move at the target.

The first electrode 2 is longer than the second electrode 3, extending downstream, along the optical axis 10, so as to form a depending portion or part 13. The depending portion 13 has a length, L, about 10 mm. The depending portion 13 carries the stopper 4. The aperture 5 is arranged on a beam-side face 14 of the depending portion 13 of the first electrode 2. The beam-side face 14 tapers inwardly at angle of about 1° relative to face 8.

The first electrode 2 and the stopper 4 are unitary, formed from a single block of material. However, a separate stopper element (not shown) may be provided and attached to the first electrode 2 either directly, for example by brazing the element to the first electrode 2, or indirectly, for example via a connecting means, such as a rod or plate. The separate stopper element (not shown) may be connected to the first electrode through a first resistor (not shown) and to ground through a second resistor (not shown) so as hold the separate stopper element at a different bias from the first electrode 2. The stopper element may be provided by a thin-walled cup.

The electrode 2 and the stopper 4 can be moved together relative to the beam 7 and/or to other parts of a charge particle beam system (not shown).

The first and second electrodes 2, 3 are attached to a support 15 via respective mounting means 16, 17. The stopper 4 is attached to the support 15 via the first electrode 2. The support 15 is in the form of a plate, arranged alongside the electrodes 2, 3. The mounting means 16, 17 are in the form of respective mounting plates and screws (not shown). However, the mounting means 16, 17 may each be in the form of one or more posts.

The electrodes 2, 3 and the support 15 are formed of an electrically conducting material, such as an alloy comprising 90% titanium (Ti), 6% aluminium (Al) and 4% vanadium (V). Other alloy compositions may be used and other non-magnetic alloys or metals can also be used.

The mounting means 16, 17 are formed of an electrically insulating material, such as alumina ($Al_2O_3$), although other insulating materials, such as ceramics, may be used.

This allows the first and second electrodes 2, 3 to be biased at different voltages with respect to each other and to the support 15. This arrangement permits bi-polar blanking. One of the mounting means 16, 17 may be formed of an electrically conducting material and, thus, the correspondingly mounted electrode 2, 3 is electrically connected to the support 15. If the support 15 is grounded, then the electrode 2, 3 is also grounded. This arrangement permits uni-polar blanking.

Referring to FIGS. 3 and 4, the cavity 6 is disposed within the first electrode 2. The cavity 6 opens to the beam-side face 14 via aperture 5 and is obliquely inclined with respect to the beam-side face 14. The cavity 6 provides a pocket into which electrons may be directed.

The cavity 6 is generally tubular and is defined by a cylindrical wall 18, a first end wall 19 providing a closed end to the cavity 6 and a second end wall 20 covering a lower portion of an opening to the cavity 6.

A first portion of the aperture 5 is defined by a rim portion 21 formed where a roof portion of the cylindrical wall 18 meets the beam-side face 14. A second portion of the aperture 5 is defined by a ridge portion 22 of a lip 23. The ridge portion 22 may be referred to as a "knife edge". The lip 23 provides, on a first side facing the cavity 6, the second end wall 20 and, on a second, adjacent side, another beam-facing surface 24. The lip 23 is arranged such that it juts out beyond the plane $\Sigma$ of the beam-side face 14 so as to project the aperture 5 towards the optical axis 10 (FIG. 1). The lip 23 juts out by at least the width of the electron beam 7 in this part of the system, in this case which is about 0.1 to 0.2 mm. The second end wall 20 is angled at angle $\alpha$ with respect to the beam-side face 14 to help deflect electrons into the cavity 6.

Referring to FIGS. 5a to 5c, the aperture 5 and cavity 6 are formed by drilling an obliquely inclined hole 25 from face 14 into electrode 2, chamfering a lower edge 26 of the face 14 through said hole 25 to form chamfer 27 and define a lower portion 28 of an opening to the hole 25, attaching a wedge 29 to the chamfer 27 so as to cover the lower portion 28 of the opening to the hole 25. The wedge 29 is attached by vacuum brazing the wedge 29 to the chamfer 27. The diameter of the hole 25 may be greater than its length.

When viewed perpendicularly to the face 14 (approximately along the y-axis), the aperture 5 is generally semicircular and has a radius of about 0.5 to 1 mm. When viewed along the face 14 from the upstream (approximately along the z-axis), the aperture 5 appears as a slit about 0.1 to 0.2 mm wide and 0.5 to 1 mm long with the ridge portion 22 of lip 23 having a radius, r, of about 10 μm.

Referring to FIG. 6, first and second amplifiers 30, 31 selectively apply first and second biases $V_1$, $V_2$ to the first and second electrodes 2, 3 respectively under the control of a controller 32 in the form of a microcomputer. The support 15 (FIG. 1) is grounded.

For an electron beam, the first bias $V_1$ is positive and the second bias $V_2$ is negative or grounded. The first bias $V_1$ is positive to attract negatively charged electrons. For an ion beam, the first bias $V_1$ is negative and the second bias $V_2$ is positive or grounded. The first bias $V_1$ is negative to attract positively charged electrons. The applied biases $V_1$, $V_2$ are of the order of 10V, preferably around 30V, and can be found by routine experiment. An initial estimate of applied bias for blanking can be found by considering the gap size, the beam voltage, the length of the electrodes 2, 3 and the distance between the downstream end of the electrodes 2, 3 and the stopper 4, which can be referred to as the "blanking distance".

In FIG. 1, passage of the electron beam 7 in the absence of applied blanking biases $V_1$, $V_2$ is shown. The electron beam 7 passes through the gap 11 along the optical axis 10 undeflected.

In FIG. 2, passage of the electron beam 7 in the presence of applied biases $V_1$, $V_2$ is shown. With biases $V_1$, $V_2$ applied, the electron beam 7 is deflected through the aperture 5 and into the cavity 6. Electrons are absorbed by the walls 18, 19, 20 of the cavity 6. Escape of secondary electrons and backscatter electrons is reduced since the walls 18, 19, 20 are at a bias of the same polarity as the first blanking voltage $V_1$, i.e. negative. For an ion beam, escape of backscattered ions is similarly reduced since the walls 18, 19, 20 are at a bias of the same polarity as the first blanking voltage $V_1$, i.e. positive.

The stopper 4 is electrically and mechanically connected to the first electrode 2. This arrangement can help not only to reduce escape of secondary and backscatter electrons when the beam 7 is deflected into the cavity 6, but also it can make it easier to orientate the blanking unit 1 to the beam 7.

The stopper 4 is at the same potential as the first electrode 2. However, the stopper 4 may be electrically connected by means of a potential divider (not shown) comprising first and second resistors (not shown). Thus, the stopper 4 may be biased at a different bias from the first electrode 2 but still have the same polarity.

Second Embodiment

Figure 7:
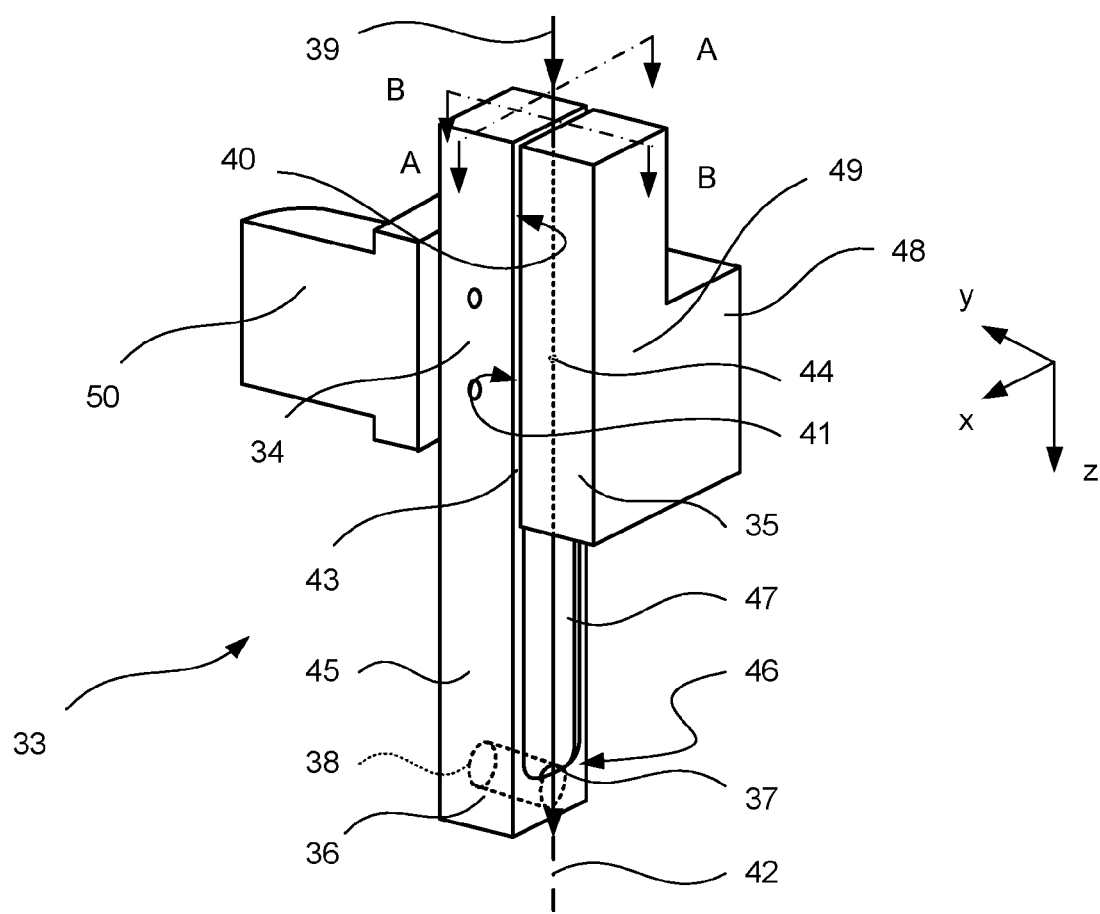
FIG. 7 is perspective view of a second embodiment of a beam blanking unit according to the present invention.

Referring to FIG. 7, a second embodiment of a beam blanking unit 33 according to the present invention is shown. The beam blanking unit 33 includes first and second electrodes 34, 35, commonly referred to as "blanking electrodes" or "blanking plates", and a stopper 36 having an aperture or opening 37 and a cavity 38 for stopping an electron beam 39.

The electrodes 34, 35 are generally elongated and rectangular in transverse cross-section. The electrodes 34, 35 are longitudinally arranged in parallel, with parallel opposing faces 40, 41 either side of an optical axis 42, which define a gap 43 through which an electron beam 39 can pass. The gap 43 between the faces 40, 41 has a width of about 0.4 mm. Each opposing face 40, 41 has a width, w, of about 5 mm and a length, l, of about 10 mm. The electrodes 34, 35 are arranged such that an intermediate focus point or crossover 44 of the electron beam 39 is found about halfway down the gap 43. This is to provide conjugate blanking, i.e. blanking where the beam does not move at the target.

The first electrode 34 is longer than the second electrode 35, extending downstream, along the optical axis 42, so as to form a depending portion 45. The depending portion 45 has a length of about 10 mm. The depending portion 45 carries the stopper 36. The aperture 37 is arranged on a beam-side face 46 of the depending portion 45. The beam-side face 46 tapers inwardly at angle of about 1° relative to face 40.

The first electrode 34 and the stopper 36 are unitary, formed from a single block of material. However, a separate stopper element (not shown) may be provided and attached to the first electrode 34 either directly, for example by brazing the stopper element to the first electrode 34, or indirectly, for example via a connecting means, such as a rod or plate. The separate stopper element (not shown) may be connected to the first electrode through a first resistor (not shown) and to ground through a second resistor (not shown) so as hold the separate stopper element at a different bias from the first electrode 34. The stopper 36 may be provided by a thin-walled cup.

The beam-side face 46 includes a recess 47 which is used to form the aperture 37.

The second electrode 35 is mounted on a support 48. The second electrode 35 and the support 48 are unitary, formed from a single block of material. However, a separate support may be provided and attached to the second electrode 36. The support 48 is in the form of an arm which extends laterally from a lower portion 49 of the second electrode 36 and turns through 180° around the first electrode 34. The arm 47 turns back through 90° to provide an end 50 for holding the arm 48.

Referring to FIG. 8, the first electrode 34 is attached to an intermediate portion 51 of the arm 48. The first electrode 34 is attached to the arm 48 by fastening means 52 in the form of electrically conducting screws or pins. However, the first and second electrodes 34, 35 and the arm 48 are electrically insulated from one another by insulating means 53 in the form of alumina bushes.

The first and second electrodes 34, 35 and arm 48 are formed from electrically conducting material, such as an alloy comprising 90% titanium (Ti), 6% aluminium (Al) and 4% vanadium (V). However, other proportions can be used and other non-magnetic alloys or metals can be used. The insulating means 53 are formed from alumina, although other ceramics may be used.

Referring to FIG. 9, the cavity 38 is disposed within the first electrode 34. The cavity 38 opens to the beam-side face 46 via aperture 37 and is obliquely inclined with respect to the beam-side face 46. The cavity 38 provides a pocket into which electrons may be directed.

The cavity 38 is generally tubular and is defined by a cylindrical wall 54, a first end wall 55 providing a closed end to the cavity 38 and a second end wall 56 covering a lower portion of an opening to the cavity 38.

The aperture 37 is defined by a rim formed where a roof portion of the cylindrical wall 54 and second end wall 56 meets a face 57 and/or wall 58 of recess 47, thus forming a ridge 59 of a lip 60. The ridge 59 may be referred to as a "knife edge". The lip 60 is arranged such that it juts out beyond the plane F of the recess face 57 so as to project the aperture 37 towards the optical axis 42 (FIG. 7). The lip 60 juts out by at least the width of the electron beam 39 in this part of the system, in this case which is about 0.1 to 0.2 mm. The second end wall 56 is angled at angle β with respect to the recess face 57 to help deflect electrons into the cavity 38. The first end wall 55 is provided by a screw 61 inserted from reverse face 62, in other words the face on the reverse side of the first electrode 34 from the beam-side face 46.

Figure 10:
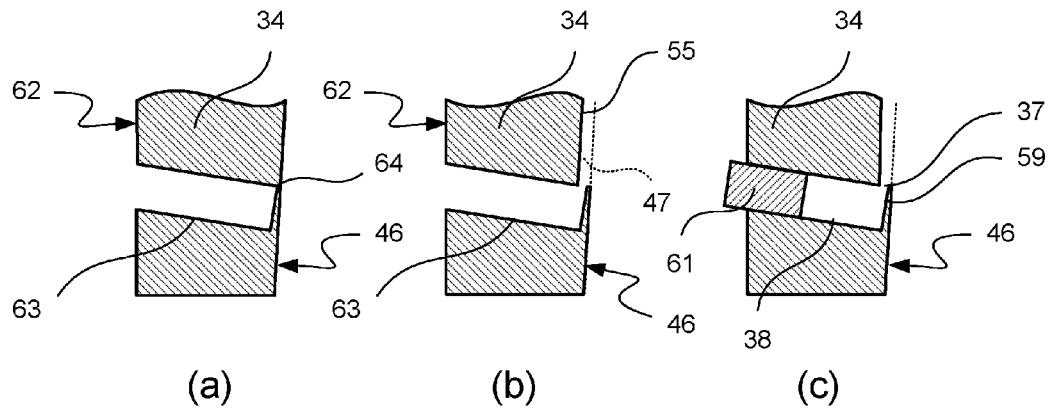
FIG. 10a to 10c illustrate fabrication of the aperture and cavity shown in FIG. 7.

Referring to FIGS. 10a to 10c, the aperture 37 and cavity 38 are formed by drilling a downwardly angled hole 63 into the depending portion 45 of the first electrode 34 from the reverse face 62. The hole 63 has a diameter of about 1 to 2 mm. The hole 63 is drilled almost, but not quite, through to the beam-side face 46. A forward edge 64 of the hole 63 stops a given distance from the beam-side face 46. The recess 47 is cut into the beam-side face 46. The recess is about 0.1 to 0.2 mm deep. The depth of the recess 47 is greater than the given distance so as to break through to the hole 63. The hole 63 is plugged on the reverse face 62 using screw 61.

When viewed along the face 46 from upstream (approximately along the z-axis), the aperture 37 appears as a slit with a beam-side ridge 59 having a radius of about 10 μm.

Figure 11:
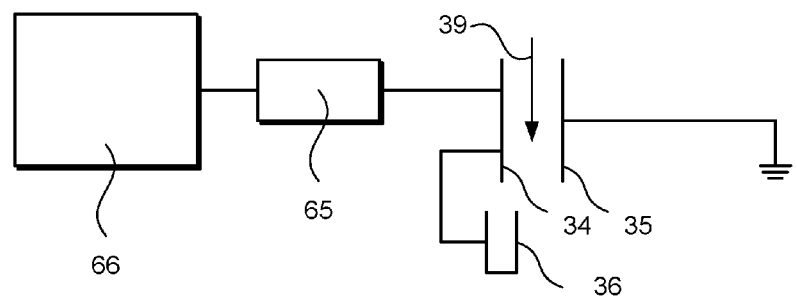
FIG. 11 is a schematic diagram of a control system for controlling the unit shown in FIG. 7.

Referring to FIG. 11, an amplifier 65 selectively applies a blanking bias V to the first electrode 34 under the control of a controller 66 in the form of a microcomputer. The second electrode 35 is grounded.

For an electron beam, the bias V is positive and about 30 V. For an ion beam, the bias is negative.

In the absence of an applied blanking bias V, the electron beam 39 passes through the gap 43 along the optical axis 42.

In the presence of and applied blanking bias V, the electron beam 39 is deflected through the aperture 37 and into the cavity 38. Electrons are absorbed by the walls 54, 55, 56 of the cavity 38. Escape of secondary electrons and backscatter electrons is reduced since the walls 54, 55, 56 are at a bias which is of the same polarity as the blanking voltage V, i.e.

negative. For an ion beam, escape of backscattered ions is similarly reduced because since the walls 54, 55, 56 are at a bias which is of the same polarity as the blanking voltage V, i.e. positive.

The stopper 36 is electrically and mechanically connected to the first electrode 34. This arrangement can help not only to reduce escape of secondary and backscatter electrons when the beam 39 is deflected into the cavity 38, but also it can make it easier to orientate the blanking unit 33 to the beam 39.

The stopper 36 is at the same potential as the first electrode 34. However, the stopper 36 may be electrically connected by means of a potential divider (not shown). Thus, the stopper 36 may be biased at a different bias from the first electrode 2, but have the same polarity.

Figure 12:
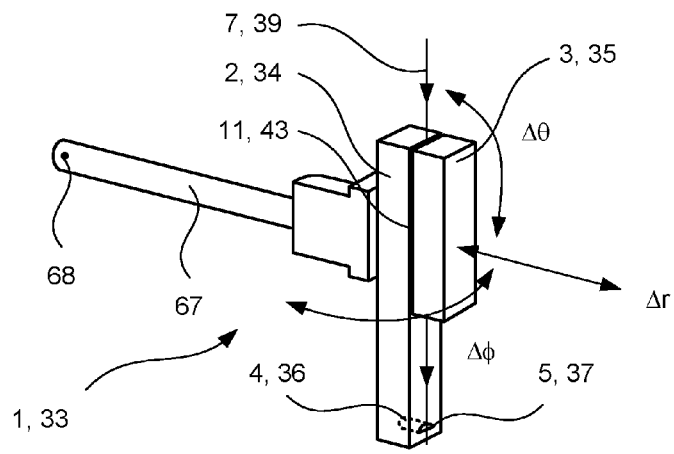
FIG. 12 shows adjustment and alignment of a beam blanking unit in accordance with the present invention.

Referring to FIG. 12, the blanking unit 1, 33 is carried on an arm 67. The arm 67 may be tilted through an angle $\Delta\theta$ or azimuthally rotated through an angle $\Delta\phi$ about pivot 68 and extended or retracted by a length $\Delta r$. This helps not only to align the beam 7, 39 with the gap 11, 43, but also to align the deflected beam with the aperture 5, 37 of the stopper 4, 36. Thus, a smaller blanking aperture may be used.

From reading the present disclosure, other variations and modifications will be apparent to persons skilled in the art. Such variations and modifications may involve equivalent and other features which are already known in the design, manufacture and use of charged particle beam systems and component parts thereof and which may be used instead of or in addition to features already described herein. For example, although electron beam blanking has been described, the blanking unit may be modified, for example by changing the dimensions of the blanking plates and the applied biases, to blank an ion beam. Features of one embodiment may be replaced or supplemented by features of another embodiment.

Although claims have been formulated in this application to particular combinations of features, it should be understood that the scope of the disclosure of the present invention also includes any novel features or any novel combination of features disclosed herein either explicitly or implicitly or any generalization thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

The invention claimed is:

1. An apparatus for blanking a charged particle beam comprising:
   first and second electrodes for deflecting a charged particle beam passing between the electrodes; and
   a stopper for a deflected charged particle beam;
   wherein said first electrode is longer than the second electrode thereby defining a depending portion and wherein the stopper is formed in said depending portion.

2. The apparatus according to claim 1, wherein said stopper includes an aperture.

3. The apparatus according to claim 1, wherein said stopper includes a cavity.

4. The apparatus according to claim 1, wherein said stopper includes a knife edge.

5. The apparatus according to claim 1, further comprising means for applying a bias to said first electrode.

6. The apparatus according to claim 1, comprising a cavity which opens to a beam-side face of said first electrode or an element supported by said first electrode via an aperture.

7. The apparatus according to claim 6, wherein said cavity is obliquely inclined with respect to said beam-side face.

8. The apparatus according to claim 6, wherein said cavity is defined by a cylindrical wall, a first end wall providing a closed end to said cavity and a second end wall.

9. The apparatus according to claim 8, wherein a first portion of said aperture is defined by a rim portion formed where a roof portion of said cylindrical wall meets said beam-side face.

10. The apparatus according to claim 9, wherein a second portion of said aperture is defined by a ridge portion of a lip, said lip providing said second end wall.

11. The apparatus according to claim 10, wherein said lip is arranged to jut out towards an optical axis.

12. The apparatus according to claim 8, wherein said aperture is defined by a rim formed where a roof portion of said cylindrical wall and second end wall meets a recess in said beam-side face.

13. A method of fabricating apparatus for blanking a charged particle beam, the method comprising:
   providing first and second electrodes for deflecting a charged particle beam passing between the electrodes;
   drilling a hole into said first electrode from a face of said first electrode;
   chamfering a lower edge of said face through said hole to form a chamfer;
   attaching a wedge to said chamfer so as to cover a portion of said hole; and
   providing a second electrode, wherein said first electrode is longer than the second electrode thereby defining a depending portion, wherein the hole is drilled in the depending portion.

14. A method of fabricating apparatus for blanking a charged particle beam, the method comprising:
   providing first and second electrodes for deflecting a charged particle beam passing between the electrodes, the first electrode having a first and second faces, said first and second faces being on opposite sides of said electrode;
   drilling an angled hole into said electrode from said first face whereby a forward edge of said hole stops a given distance from said second face;
   cutting a recess into said second face, said recess having a depth greater than said given distance so as to break through to said hole; and
   providing a second electrode, wherein said first electrode is longer than the second electrode thereby defining a depending portion, wherein the angled hole is drilled in the depending portion.

15. An apparatus for blanking a charged particle beam comprising:
   first and second electrodes for deflecting a charged particle beam passing between the electrodes; and
   means for stopping a deflected charged particle beam;
   wherein said first electrode is longer than the second electrode thereby defining a depending portion and wherein the means for stopping is formed in said depending portion.

16. An apparatus according to claim 15, wherein said means for stopping includes an aperture.

17. An apparatus according to claim 15, wherein said means for stopping includes a cavity.

18. An apparatus according to claim 15, wherein said means for stopping includes a knife edge.

* * * * *